(12) United States Patent
Chen et al.

(10) Patent No.: US 8,048,747 B1
(45) Date of Patent: Nov. 1, 2011

(54) METHOD OF MANUFACTURING EMBEDDED METAL-OXIDE-NITRIDE-OXIDE-SILICON MEMORY DEVICE

(75) Inventors: Min-Cheng Chen, Hsinchu (TW); Hou-Yu Chen, Hsinchu (TW); Chia-Yi Lin, Hsinchu (TW)

(73) Assignee: National Applied Research Laboratories, Hsinchu (TW)

( * ) Notice: Subject to any disclaimer, the term of this patent is extended or adjusted under 35 U.S.C. 154(b) by 0 days.

(21) Appl. No.: 12/917,690

(22) Filed: Nov. 2, 2010

(51) Int. Cl.
*H01L 21/336* (2006.01)
*H01L 21/8238* (2006.01)
*H01L 21/8236* (2006.01)

(52) U.S. Cl. ........ 438/288; 438/217; 438/276; 438/278; 438/287; 438/289; 257/E21.159; 257/E21.408; 257/E21.409; 257/E21.613

(58) Field of Classification Search ........... 257/E21.159, 257/E21.408, E21.409, E21.613
See application file for complete search history.

(56) References Cited

U.S. PATENT DOCUMENTS

| | | | |
|---|---|---|---|
| 6,501,111 B1 * | 12/2002 | Lowrey | 257/295 |
| 7,361,554 B2 * | 4/2008 | Park et al. | 438/266 |
| 7,795,677 B2 * | 9/2010 | Bangsaruntip et al. | 257/347 |
| 7,859,066 B2 * | 12/2010 | Kito et al. | 257/411 |
| 7,969,188 B2 * | 6/2011 | Wang | 326/49 |
| 7,972,927 B2 * | 7/2011 | Fujitsuka et al. | 438/264 |
| 7,977,748 B2 * | 7/2011 | Kito et al. | 257/347 |

* cited by examiner

*Primary Examiner* — Mohsen Ahmadi
(74) *Attorney, Agent, or Firm* — Jackson IPG PLLC; Demian K. Jackson

(57) ABSTRACT

The present disclosure fabricates an embedded metal-oxide-nitride-oxide-silicon (MONOS) memory device. The memory device is stacked with memory layers having a low aspect ratio. The memory device can be easily fabricated with only two extra masks for saving cost. The present disclosure uses a general method for mass-producing TFT and is thus fit for fabricating NAND-type or NOR-type flash memory to be used as embedded memory in a system-on-chip.

11 Claims, 9 Drawing Sheets

METHOD OF MANUFACTURING EMBEDDED METAL-OXIDE-NITRIDE-OXIDE-SILICON MEMORY DEVICE

TECHNICAL FIELD OF THE DISCLOSURE

The present disclosure relates to manufacturing memory device; more particularly, relates to manufacturing an embedded memory device in a system-on-chip through a compatible semiconductor metal back-end process.

DESCRIPTION OF THE RELATED ARTS

Flash memory becomes the main stream of non-volatile memory. For high storage capacity, dimension scaling of planar memory device has reached its limit. Hence, three-dimensional (3D) stacked memory devices are developed. However, complex procedure for stacking memory devices causes two big problems: it is not easy to be fabricated and parasitic resistance effect on connection has to be solved.

In 2006, a flash memory of multi-layer stacked thin film transistor (TFT) was introduced. Yet, it had to face a microfilming difficulty on stacking dielectric layer and gate in a poly-silicon channel first structure.

In most other cases, like U.S. Pat. No. 6,501,111 and U.S. Pat. No. 7,361,554, a hole is firstly obtained in an inter layer dielectric (ILD) before making the memory device. Yet, the procedure may become complex to deposit multiple layers of devices in a tiny trench. For example, in U.S. Pat. No. 7,361,554, complexity on fabricating the memory device is greatly increased; and, although its vertical memory device may increase memory unit concentration, interference between memory units is greatly increased too.

In 2007, Y. Fukuzumi introduced gate-first deposited with poly-silicon to punch and plung memory units. Although the complexity is thus reduced, it still faces a high aspect ratio problem. Furthermore, on connecting source/drain (S/D) electrodes on different layers by using poly-silicon, parasitic resistance effect between wires becomes even worse.

In 2009, A. Hubert introduced nano wires of gate-all-around for better gate control ability. However, its complex structure may make future development and application even harder.

Hence, the prior arts do not fulfill all users' requests in actual use.

SUMMARY OF THE DISCLOSURE

The main purpose of the present disclosure is to manufacture an embedded memory device in a system-on-chip through a compatible semiconductor metal back-end process.

To achieve the above purpose, the present disclosure is a method of manufacturing an embedded metal-oxide-nitride-oxide-silicon (MONOS) memory device, comprising steps of: (a) providing a dielectric isolation layer having a conductive layer used as a bottom gate of a gate-first structure; (b) processing thermal oxidation to obtain a bottom dielectric layer on the dielectric isolation layer, where the bottom dielectric layer has an oxide-nitride-oxide structure; (c) depositing a poly-silicon layer on the bottom dielectric layer; (d) forming a nano-wire region on the poly-silicon layer to obtain a S/D ion implant region in the poly-silicon layer; (e) forming a channel region on the S/D ion implant region by using a mask to obtain an active region on the poly-silicon layer; (f) processing ion implantation to implanting ions into the S/D ion implant region to obtain S/D electrodes; and (g) after removing the mask, activating implanted ions in the S/D electrodes through low-temperature annealing to form a channel between the S/D electrodes in the active region to obtain a single-layer embedded MONOS memory device. Accordingly, a novel method of manufacturing an embedded MONOS memory device is obtained.

BRIEF DESCRIPTIONS OF THE DRAWINGS

The present disclosure will be better understood from the following detailed descriptions of the preferred embodiments according to the present disclosure, taken in conjunction with the accompanying drawings, in which FIG. 1 is the sectional view showing the memory device made through the first preferred embodiment according to the present disclosure;

DESCRIPTION OF THE PREFERRED EMBODIMENTS

The following descriptions of the preferred embodiments are provided to understand the features and the structures of the present disclosure.

Figure 1:
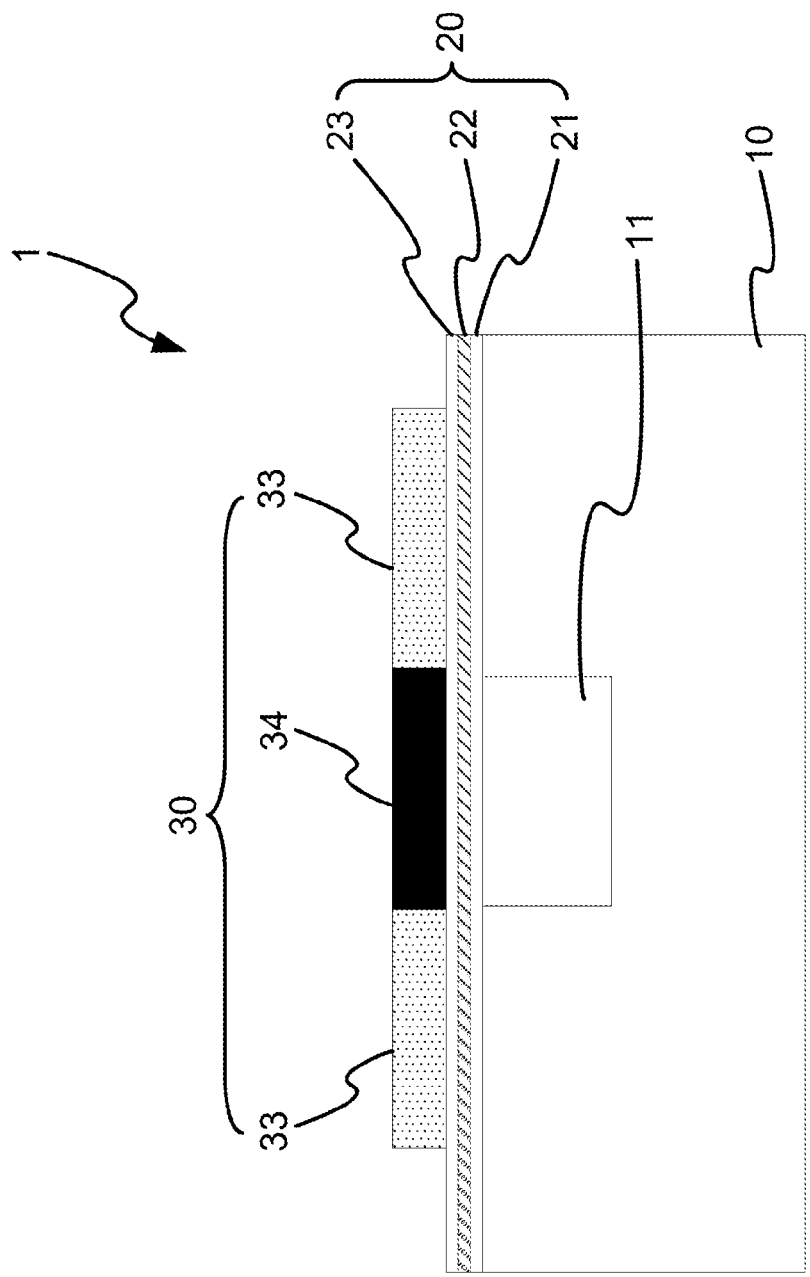
Figure 2:
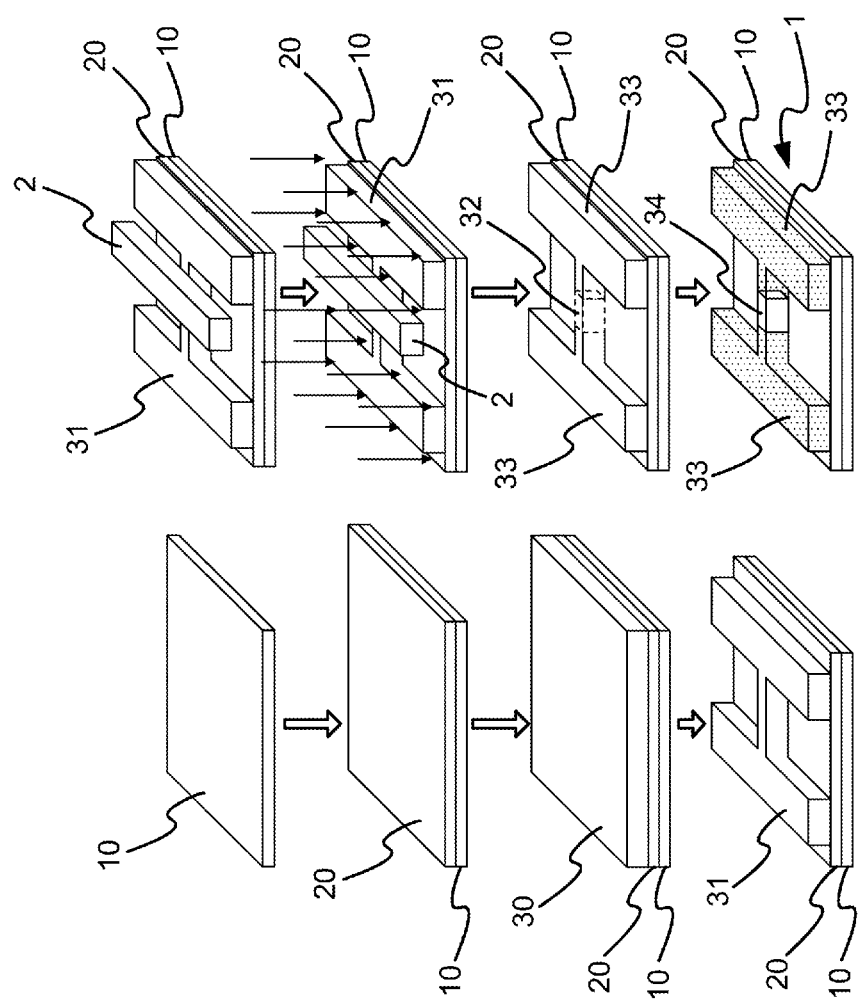
FIG. 2 is the flow view showing the first preferred embodiment.

Please refer to FIG. 1 and FIG. 2, which are a sectional view showing a memory device made through a first preferred embodiment according to the present disclosure; and a flow view showing the first preferred embodiment. As shown in the figures, the present disclosure is a method of manufacturing an embedded metal-oxide-nitride-oxide-silicon (MONOS) memory device, where the embedded MONOS memory device manufactured according to the first preferred embodiment of the present disclosure comprises a dielectric isolation layer 10 (inter layer dielectric, ILD), a bottom dielectric layer 20 and a poly-silicon layer 30. The first preferred embodiment according to the present disclosure comprises the following steps:

(a) A dielectric isolation layer 10 is provided. The dielectric isolation layer 10 uses a metal layer as a bottom gate 11 of a gate-first structure.

(b) Thermal oxidation is processed to form a bottom dielectric layer 20 on the dielectric isolation layer 10, where the bottom dielectric layer 20 comprises a bottom oxide layer 21 stacked on the dielectric isolation layer 10; a nitride layer 22 stacked on the bottom oxide layer 21; and a top oxide layer 23 stacked on the nitride layer 22. Thus, an oxide-nitride-oxide (O/N/O) structure is formed.

(c) A poly-silicon layer 30 is deposited on the top oxide layer 23 of the bottom dielectric layer 20.

(d) A nano-wire region is defined on the poly-silicon layer 30 by using a first mask (not shown in the figure) so that a source/drain (S/D) ion implant region 31 on the poly-silicon layer 30 is included in the poly-silicon layer 30.

(e) A channel region is defined on the S/D ion implant region 31 of the poly-silicon layer 30 by using a second mask 2 so that an active region 32 on the poly-silicon layer 30 is further included in the poly-silicon layer 30.

(f) Ion implantation is processed to implant ions into the S/D ion implant region 31 of the poly-silicon layer 30 for forming S/D electrodes 33, where bit lines are buried in the S/D electrodes 33.

(g) After removing the second mask 2, the implanted ions in the S/D electrodes 33 of the poly-silicon layer 30 are activated through low-temperature annealing at a temperature between 540 and 660 Celsius degrees (° C.) for a time period between 27 and 33 minutes (min), so that a channel 34 is formed between the S/D electrodes 33 in the active region 32 above the poly-silicon layer 30. Thus, a single-layer embedded MONOS memory device 1 is manufactured.

The oxide layers 22, 24 are made of silicon oxide. The nitride layer 23 is made of silicon nitride to be used as a charge storage layer. The present disclosure uses a general technology of a thin film transistor (TFT) in a nano device lab for manufacturing the embedded MONOS memory device by depositing multiple thin films through a simple procedure. Therein, the present disclosure activates implanted ions in the S/D electrodes 33 of the poly-silicon layer 30 through low-temperature annealing while below electrode controls gate voltage for conductivity and defects of silicon nitride of the O/N/O structure in the bottom dielectric layer 20 are used for storing charge.

Figure 3:
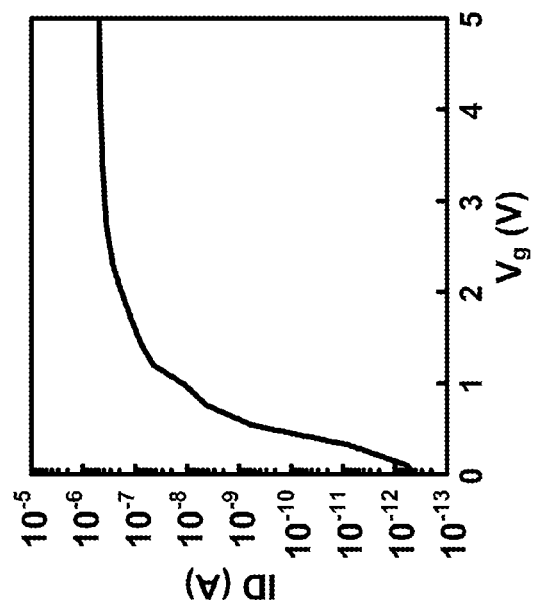
FIG. 3 is the view showing the Id-Vg data obtained through actual measurement.
Figure 4:
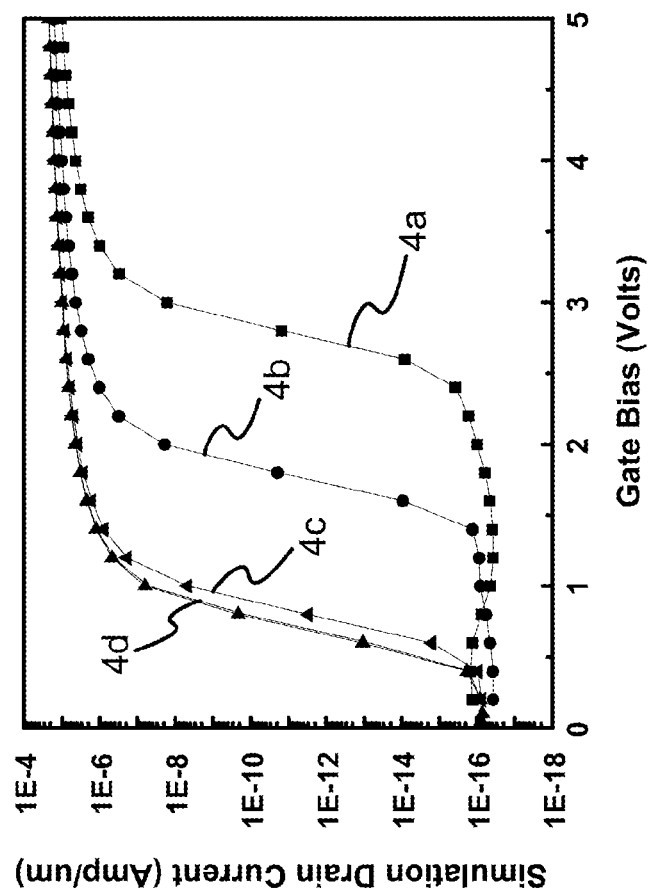
FIG. 4 is the view showing the Id-Vg data obtained through the electrical simulation.

Please refer to FIG. 3 and FIG. 4, which are views showing Id-Vg data obtained through actual measurement and through an electrical simulation. As shown in the figures, the present disclosure processes annealing at 600° C. for 30 min. In FIG. 3, the low-temperature annealing process is totally compatible with general semiconductor metal back-end process In FIG. 4, an electrical simulation software, medici, is used to acquire changes on electrical characteristics of a memory device by different charges in a bottom dielectric layer. Simulation curves $4a,4b,4c$ for doping ratios of $2\ e^{16}/cm^3$, $1\ e^{16}/cm^3$ and $1\ e^{15}/cm^3$ are compared with a reference curve $4d$. It shows that threshold voltages are obviously changed.

Figure 5:
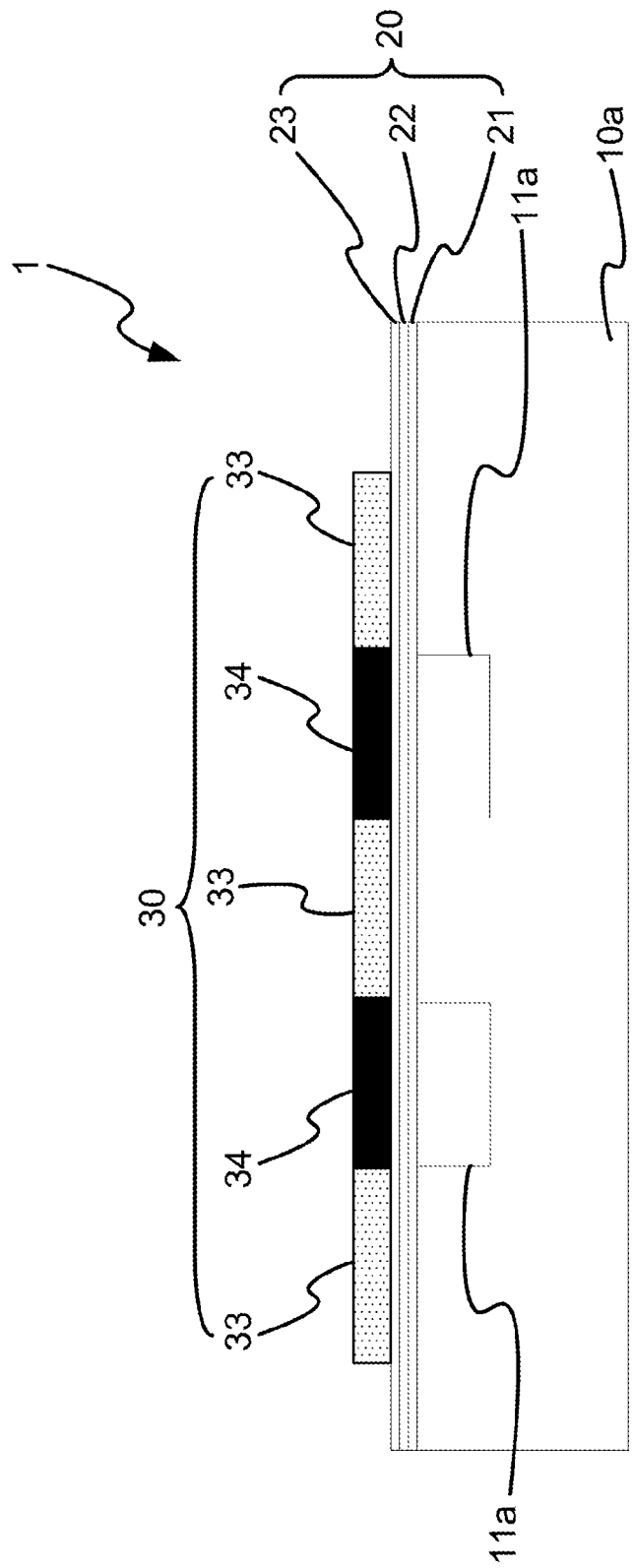
FIG. 5 is the sectional view showing the second preferred embodiment.

Please refer to FIG. 5, which is a sectional view showing a second preferred embodiment. As shown in the figure, a dielectric isolation layer 10a has at least one metal layer used as a bottom gate 11a of a gate-first structure.

On using the present disclosure, the metal bottom gate 11a is used to connect word lines for greatly reducing parasitic resistance.

Figure 6:
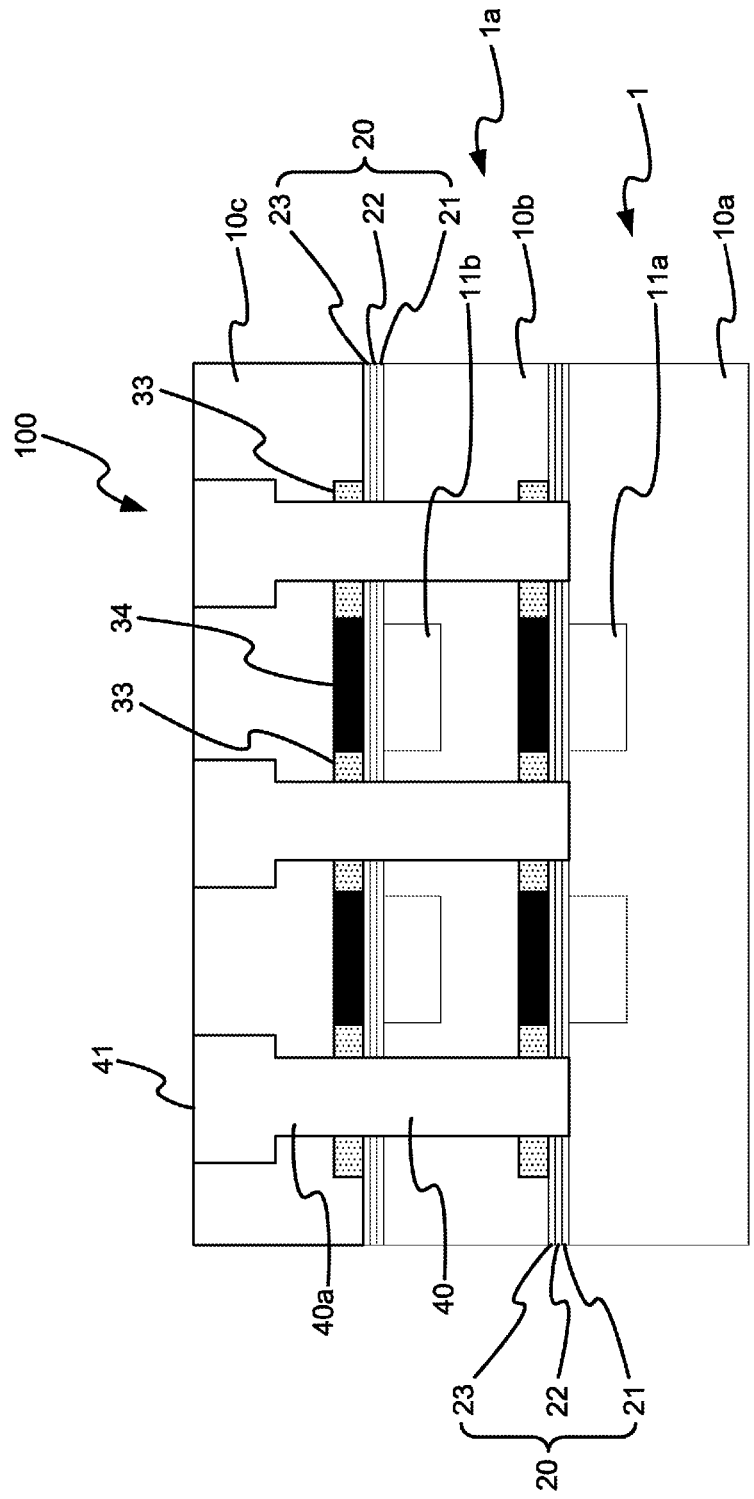
FIG. 6 is the sectional view showing the third preferred embodiment.

Please refer to FIG. 6, which is a sectional view showing a third preferred embodiment. As shown in the figure, multiple metal layers are stacked. A single-layer embedded MONOS memory 1 is stacked with another dielectric isolation layer 10b for separating layers of MONOS memory devices 1,1a. Furthermore, on stacking layers of MONOS memory devices 1a (only one layer is shown in the figure), at least one via 40 is formed in the dielectric isolation layer 10b and a dielectric isolation layer 10c is stacked on the most top layer of MONOS memory device 1a with a pad 41 formed. The dielectric isolation layer 10c also has a via 40a formed within. Each via 40a is corresponding to a pad 41. Every via 40,40a in the dielectric isolation layer 10b,10c is perpendicularly penetrated to a surface of a dielectric isolation layer 10a on the most bottom layer of MONOS memory device 1. Thus, a multi-layer stacked embedded 3D memory device array 100 is formed.

On using the present invention, the multi-layer stacked embedded 3D memory device array 100 uses the metal layers in the dielectric isolation layers 10a,10b as metal bottom gates 11a,11b of a gate-first structure to connect word lines; and uses the at least one via 40,40a in the dielectric isolation layer 10b,10c to electrically connect bit lines on the S/D electrodes 33 of every layer of MONOS memory device 1,1a. Thus, owing to low resistance of the bottom gates 11a,11b and by using the at least one via 40,40a, parasitic resistance generated on connecting the layers of MONOS memory devices 1,1a is greatly reduced.

Figure 7:
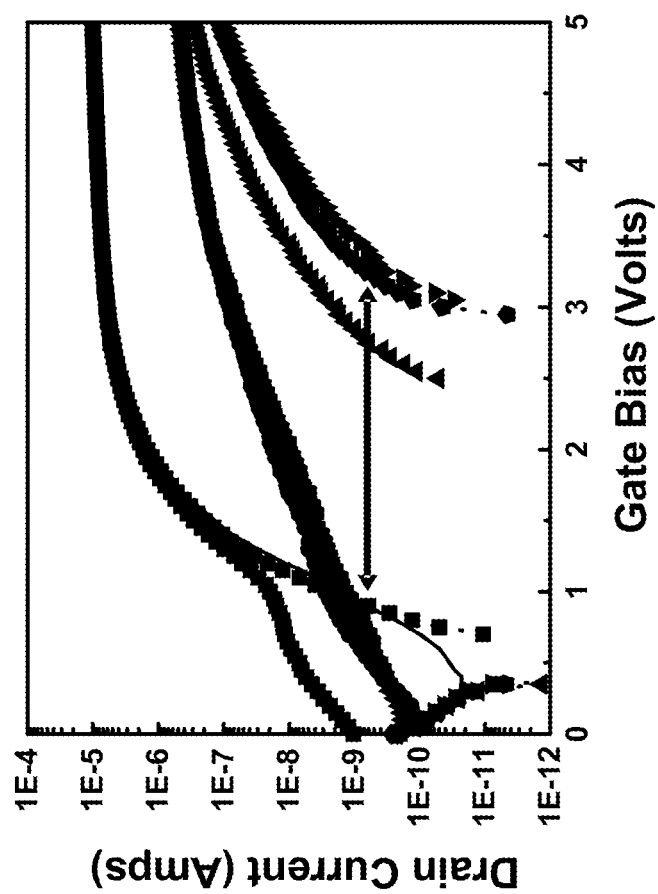
FIG. 7 is the view showing the P/E characteristics through actual measurement.
Figure 8:
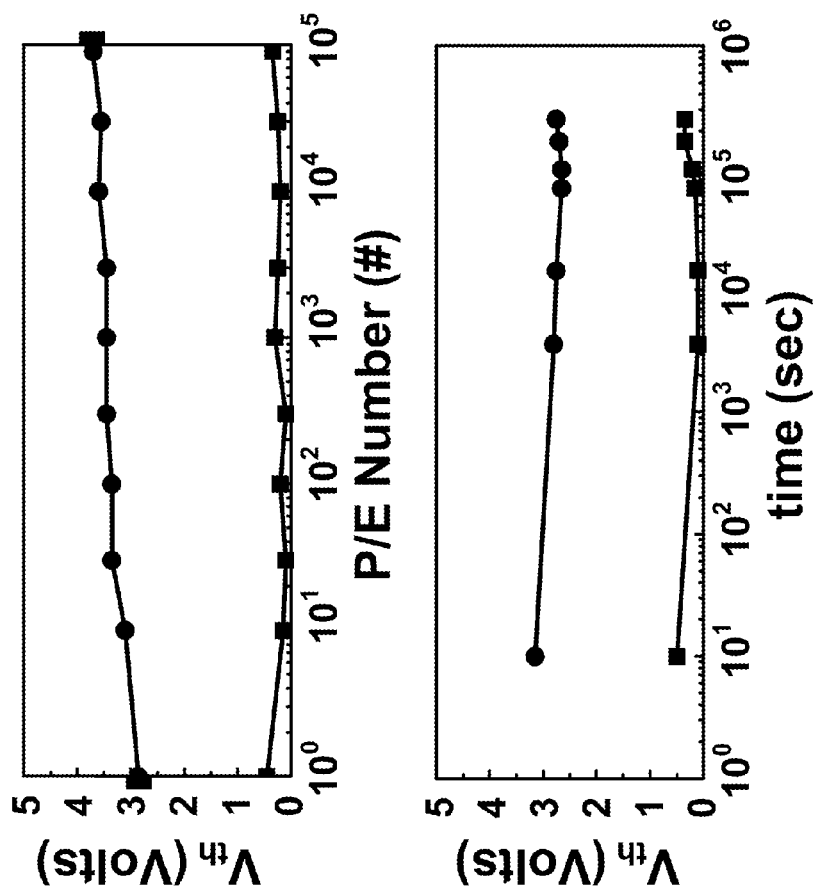
FIG. 8 is the view showing the P/E efficiency of the memory device.
Figure 9:
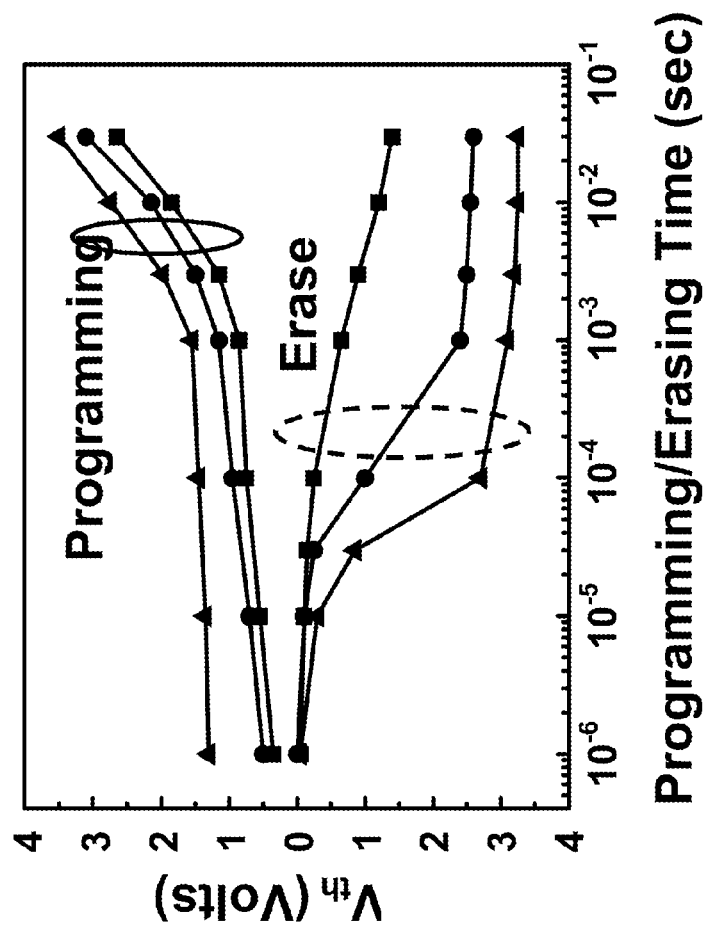
FIG. 9 is the view showing the reliability of the memory device.

Please refer to FIG. 7 to FIG. 9, which are a view showing P/E characteristics through actual measurement; a view showing P/E efficiency of a memory device; and a view showing reliability of the memory device. As shown in the figures, various program/erase (P/E) memory windows are controlled by various gate voltages. In FIG. 7, threshold voltage variety is bigger than 2 volts. In FIG. 8, P/E velocity reaches 105 and storage time is at least 3 days, which shows characteristics of a non-volatile memory. In FIG. 9, it shows that, through various operation voltages and time periods for P/E operations, the present disclosure controls memory windows.

The present disclosure uses two extra masks to manufacture an embedded MONOS memory device. Multi-layers of metal are stacked in back-end process to form multi-layer stacked 3D memory array for reducing circuit area. A process for fabricating low-temperature deposited poly-silicon TFT used in the present disclosure is compatible with other semiconductor circuit manufacture process and is thus suitable for mass production of large-scale NAND-type or NOR-type flash memory to be used as embedded memory of a system-on-chip.

The gate-first and the mask used in the present disclosure avoid inequality and reduce high aspect ratio effectively on stacking memory devices. Furthermore, only two extra masks are used for defining gates in memory device so that complexity and cost for manufacture are greatly decreased. The present disclosure uses ILD in the back-end process to separate layers of memory devices and a chemical mechanical polish (CMP) process to achieve high smoothing for stacking a multi-layer memory array.

To sum up, the present disclosure is a method of manufacturing an embedded MONOS memory device, where a 3D memory device is easily manufactured with two extra masks used in a general back-end process for reducing cost and complexity in manufacture; and, in a multi-layer stacked 3D memory array, parasitic resistance between layers of memory devices is effectively reduced by connecting metal layers through via in the back-end process.

The preferred embodiments herein disclosed are not intended to unnecessarily limit the scope of the disclosure. Therefore, simple modifications or variations belonging to the equivalent of the scope of the claims and the instructions disclosed herein for a patent are all within the scope of the present disclosure.

What is claimed is:

1. A method of manufacturing an embedded metal-oxide-nitride-oxide-silicon (MONOS) memory device, comprising the steps of:

(a) providing a dielectric isolation layer,
wherein said dielectric isolation layer has a conductive layer used as a bottom gate of a gate-first structure;

(b) processing thermal oxidation to obtain a bottom dielectric layer on said dielectric isolation layer, wherein said bottom dielectric layer comprises a bottom oxide layer, a nitride layer and a top oxide layer stacked one after one to obtain an oxide-nitride-oxide structure;
(c) depositing a poly-silicon layer on said bottom dielectric layer;
(d) obtaining a nano-wire region on said poly-silicon layer by using a first mask so that a source/drain (S/D) ion implant region on said poly-silicon layer is included in the poly-silicon layer;
(e) obtaining a channel region on said S/D ion implant region of said poly-silicon layer by using a second mask to obtain an active region on said poly-silicon layer;
(f) processing ion implantation to implanting ions into said S/D ion implant region of said poly-silicon layer to obtain S/D electrodes,
wherein bit lines are buried in said S/D electrodes;
(g) removing said second mask; and
(h) after removing said second mask, activating implanted ions in said S/D electrodes of said poly-silicon layer through low-temperature annealing so that a channel is formed between said S/D electrodes in said active region on said poly-silicon layer so as to obtain a single-layer embedded MONOS memory device,
wherein said nitride layer is a charge storage layer,
wherein, in step (h), implanted ions in said S/D electrodes of said poly-silicon layer are activated through low-temperature annealing at a temperature between 540 and 660 Celsius degrees (° C.) for a time period between 27 and 33 minutes (min).

2. The method according to claim 1,
wherein said method further comprises a step of stacking another one of said dielectric isolation layer to separate layers of MONOS memory devices to obtain a multi-layer stacked embedded three-dimensional (3D) memory device array;
wherein each neighboring two of said layers of MONOS memory devices are separated by said dielectric isolation layer; and
wherein said dielectric isolation layer has at least one via.

3. The method according to claim 2,
wherein each of said layers of MONOS memory devices on said single-layer embedded MONOS memory device has at least one via in said dielectric isolation layer; and
wherein said at least one via in said dielectric isolation layer is perpendicularly penetrated to a surface of a dielectric isolation layer on a bottom layer of said layers of MONOS memory devices to electrically connect bit wires of said S/D electrodes of said layers of MONOS memory devices.

4. The method according to claim 2,
wherein a metal layer is used as a bottom gate of a gate-first structure in said dielectric isolation layer; and
wherein said multi-layer stacked embedded 3D memory device array uses said at least one via to electrically connect said layers of MONOS memory devices and said bottom gates of said gate-first structures in said dielectric isolation layers.

5. The method according to claim 2,
wherein said multi-layer stacked embedded 3D memory device array is stacked with at least one pad on said dielectric isolation layer of a top layer of said layers of MONOS memory devices; and
wherein each of said at least one pad is corresponding to one of said at least one via.

6. A method of manufacturing an embedded metal-oxide-nitride-oxide-silicon (MONOS) memory device, comprising the steps of:
(a) providing a first dielectric isolation layer,
wherein said first dielectric isolation layer has a conductive layer used as a bottom gate of a gate-first structure;
(b) processing thermal oxidation to obtain a bottom dielectric layer on said first dielectric isolation layer,
wherein said bottom dielectric layer comprises a bottom oxide layer, a nitride layer and a top oxide layer stacked one after one to obtain an oxide-nitride-oxide structure;
(c) depositing a poly-silicon layer on said bottom dielectric layer;
(d) obtaining a nano-wire region on said poly-silicon layer by using a first mask so that a source/drain (S/D) ion implant region on said poly-silicon layer is included in the poly-silicon layer;
(e) obtaining a channel region on said S/D ion implant region of said poly-silicon layer by using a second mask to obtain an active region on said poly-silicon layer;
(f) processing ion implantation to implanting ions into said S/D ion implant region of said poly-silicon layer to obtain S/D electrodes,
wherein bit lines are buried in said S/D electrodes;
(g) removing said second mask;
(h) after removing said second mask, activating implanted ions in said S/D electrodes of said poly-silicon layer through low-temperature annealing so that a channel is formed between said S/D electrodes in said active region on said poly-silicon layer so as to obtain a single-layer embedded MONOS memory device;
(i) providing a second dielectric isolation layer;
(j) forming a via in said the second dielectric isolation layer; and
wherein said nitride layer is a charge storage layer,
wherein said method is used to manufacture a flash memory selected from a group consisting of a NAND flash memory and a NOR flash memory; and
wherein said flash memory is used as an embedded memory of a system-on-chip.

7. The method according to claim 6, wherein said second dielectric isolation layer separates layers of MONOS memory devices to obtain a multi-layer stacked embedded three-dimensional (3D) memory device array;
wherein each neighboring two of said layers of MONOS memory devices are separated by said second dielectric isolation layer.

8. The method according to claim 7, wherein each of said layers of MONOS memory devices on said single-layer embedded MONOS memory device has at least one via in said second dielectric isolation layer; and wherein said at least one via in said second dielectric isolation layer is perpendicularly penetrated to a surface of a dielectric isolation layer on a bottom layer of said layers of MONOS memory devices to electrically connect bit wires of said S/D electrodes of said layers of MONOS memory devices.

9. The method according to claim 7, wherein a metal layer is used as a bottom gate of a gate-first structure in said first dielectric isolation layer; and wherein said multi-layer stacked embedded 3D memory device array uses said at least one via to electrically connect said layers of MONOS memory devices and said bottom gates of said gate-first structures in said first dielectric isolation layers.

10. The method according to claim 7, wherein said multi-layer stacked embedded 3D memory device array is stacked with at least one pad on said dielectric isolation layer of a top layer of said layers of MONOS memory devices; and wherein each of said at least one pad is corresponding to one of said at least one via.

11. The method according to claim 6, wherein, in step (h), implanted ions in said S/D electrodes of said poly-silicon layer are activated through low-temperature annealing at a temperature between 540 and 660 Celsius degrees (° C.) for a time period between 27 and 33 minutes (min).

\* \* \* \* \*